United States Patent
Mallikarjunaswamy et al.

(10) Patent No.: US 8,212,329 B2
(45) Date of Patent: Jul. 3, 2012

(54) SHORT CHANNEL LATERAL MOSFET AND METHOD

(75) Inventors: Shekar Mallikarjunaswamy, San Jose, CA (US); Amit Paul, Sunnyvale, CA (US)

(73) Assignee: Alpha and Omega Semiconductor Inc., Sunnyvale, CA (US)

( * ) Notice: Subject to any disclaimer, the term of this patent is extended or adjusted under 35 U.S.C. 154(b) by 0 days.

(21) Appl. No.: 12/941,044

(22) Filed: Nov. 6, 2010

(65) Prior Publication Data

US 2011/0049623 A1     Mar. 3, 2011

Related U.S. Application Data

(62) Division of application No. 12/112,120, filed on Apr. 30, 2008, now Pat. No. 7,851,314.

(51) Int. Cl.
    *H01L 23/58*        (2006.01)
    *H01L 29/66*        (2006.01)

(52) U.S. Cl. ........ 257/492; 257/335; 257/343; 257/493; 257/E21.214; 257/E21.417; 257/E21.427; 257/E29.04; 257/E29.256; 257/E29.266; 438/270; 438/276; 438/289; 438/301

(58) Field of Classification Search .................. 257/335, 257/343, 492, 493, E21.214, E21.417, E21.427, 257/E29.04, E29.256, E29.266; 438/270, 438/276, 289, 301
See application file for complete search history.

(56) References Cited

U.S. PATENT DOCUMENTS

| 6,927,453 | B2 * | 8/2005 | Shibib et al. | 257/336 |
| 7,671,411 | B2 * | 3/2010 | You et al. | 257/343 |
| 7,868,378 | B1 * | 1/2011 | Zuniga et al. | 257/328 |
| 2004/0065935 | A1 * | 4/2004 | Lee et al. | 257/492 |
| 2004/0238913 | A1 * | 12/2004 | Kwon et al. | 257/492 |

* cited by examiner

*Primary Examiner* — Dao H Nguyen
(74) *Attorney, Agent, or Firm* — Chein-Hwa Tsao; Chemily LLC

(57) ABSTRACT

A short channel Lateral MOSFET (LMOS) and method are disclosed with interpenetrating drain-body protrusions (IDBP) for reducing channel-on resistance while maintaining high punch-through voltage. The LMOS includes lower device bulk layer; upper source and upper drain region both located atop lower device bulk layer; both upper source and upper drain region are in contact with an intervening upper body region atop lower device bulk layer; both upper drain and upper body region are shaped to form a drain-body interface; the drain-body interface has an IDBP structure with a surface drain protrusion lying atop a buried body protrusion while revealing a top body surface area of the upper body region; gate oxide-gate electrode bi-layer disposed atop the upper body region forming an LMOS with a short channel length defined by the horizontal length of the top body surface area delineated between the upper source region and the upper drain region.

5 Claims, 12 Drawing Sheets

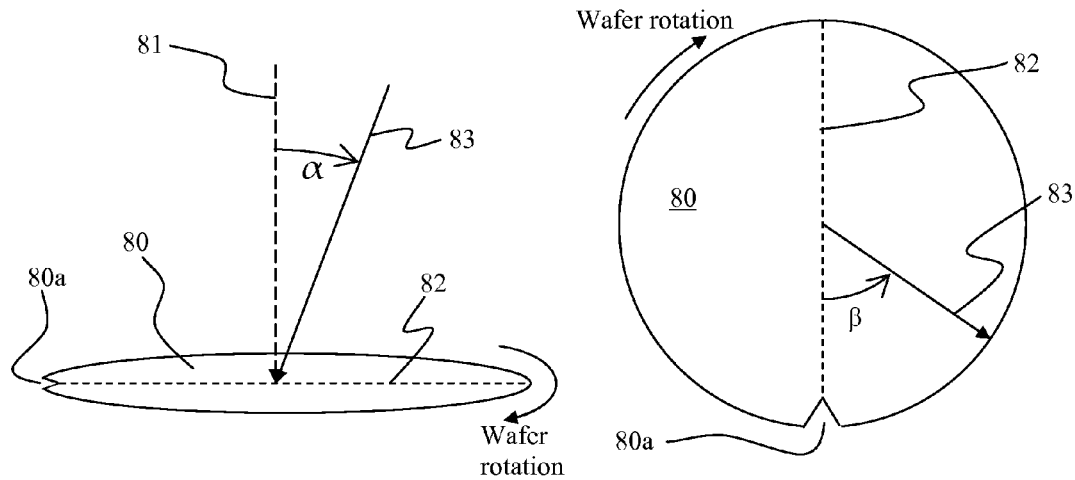
Fig. 10A Implant Tilt  Fig. 10B Implant Twist
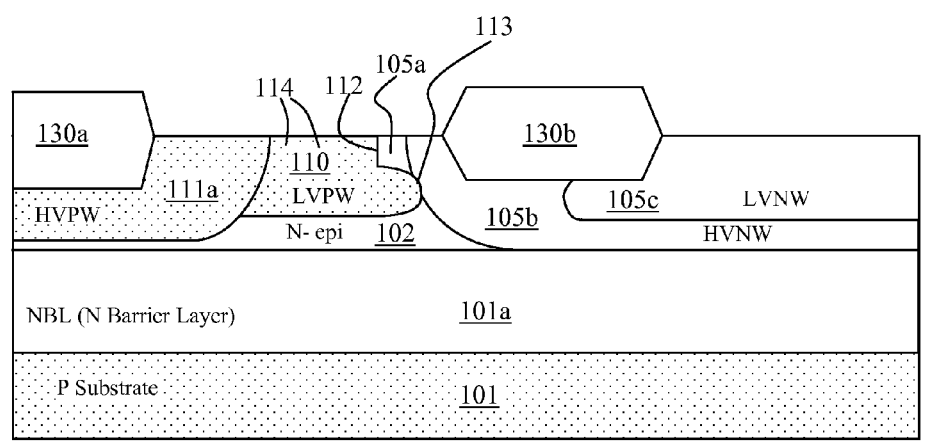
Fig. 11

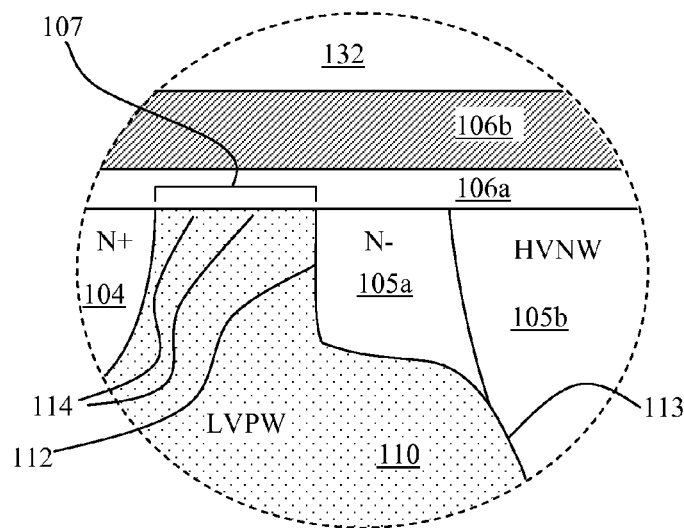
Fig. 15B AREA-"A" Enlarged
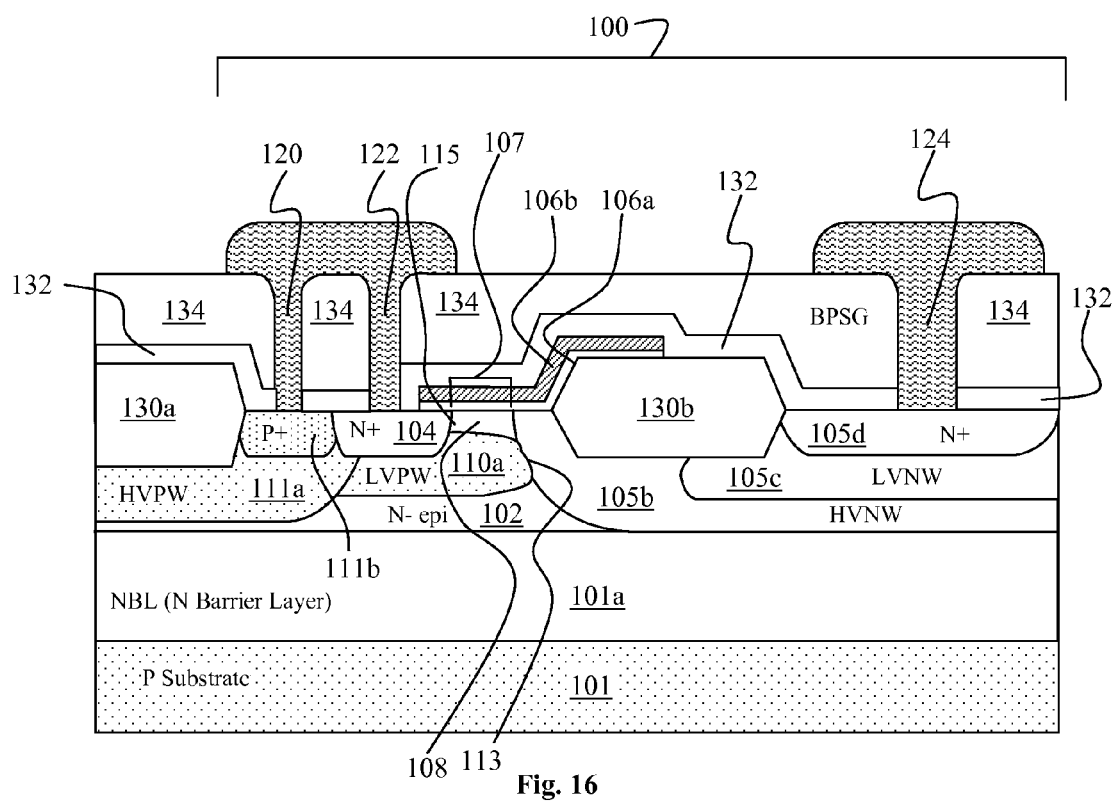
Fig. 16

SHORT CHANNEL LATERAL MOSFET AND METHOD

CROSS REFERENCE TO RELATED APPLICATIONS

This application is a divisional application of the following patent application:
"Short Channel Lateral MOSFET and Method", application Ser. No. 12/112,120, filing date Apr. 30, 2008 now U.S. Pat. No. 7,851,314 by Shekar Mallikarjunaswamy and Amit Paul
whose contents are incorporated herein by reference for any and all purpose.

FIELD OF INVENTION

This invention relates generally to the field of power electronic device structure and fabrication. More specifically, the present invention is directed to a semiconductor device structure and fabrication method for improving its performance parameters.

BACKGROUND OF THE INVENTION

MOSFET (metal-oxide-semiconductor field effect transistor) devices have many industrial applications, such as power amplifiers, power switches, low noise amplifiers and digital Integrated Circuits (IC) to name a few. As a fundamental building cell for a great variety of electronic products, the practitioners in the art of MOSFET device design and fabrication are constantly improving its performance parameters such as power efficiency, maximum operating voltage, integration density and frequency response, to name a few.

In U.S. Pat. No. 5,406,110 by Kwon, et al., a lateral double diffused insulated gate field effect transistor (LDMOS) with reduced surface field (RESURF) was described and illustrated in FIG. 1. Here, a transistor (10) has a thin epitaxial layer (14) of a second conductivity type on a semiconductor substrate (12) of a first conductivity type. A drift region (24) of the second conductivity type is formed extending through the thin epitaxial layer (14) to the substrate (12). A thick insulator layer (26) is formed on the drift region (24). An IGFET body (28) of the first conductivity type is formed adjacent the drift region (24). A source region (34) of the second conductivity type is formed within the IGFET body (28) and spaced from the drift region (24) defining a channel region (40) within the IGFET body (28). A conductive gate (32) is insulatively disposed over the IGFET body (28) and extends from the source region (34) to the thick insulator layer (26). A drain region (36) is formed adjacent the drift region (24). In the art, the conducting channel of an LDMOS device is formed laterally. Usually the source, drain and gate are located on the surface of the wafer. With the above device structure and its associated fabrication method involving a lateral double diffusion process, U.S. Pat. No. 5,406,110 described numerous technical advantages over its prior transistors and fabrication processes in the art. One technical advantage was the ability to diffuse the IGFET body (28) and still have a drift region (24) with a high doping concentration. Another technical advantage was the ability to vary the breakdown voltage rating of the output devices by simply adjusting the implant dose. Another technical advantage was the ability to fabricate multiple transistors with different breakdown voltage ratings on the same chip through proper masking of different drift region implants. Yet another technical advantage was the reduction in the on-resistance over conventional transistors while maintaining the same breakdown voltage rating. Still another technical advantage was to provide a current path between the drift region (24) and the channel region (40) necessary to avoid increasing the on-resistance of the device.

In U.S. Pat. No. 5,517,046 by Hsing, et al., a high voltage lateral DMOS (LDMOS) device with enhanced drift region was described and illustrated in FIG. 2. An LDMOS transistor structure formed in N-type silicon is disclosed which incorporates a special N-type enhanced drift region (61). In one embodiment, a cellular transistor with a polysilicon gate mesh is formed over an N epitaxial layer (52) with P body regions (59), P.sup.+ body contact regions (58), N.sup.+ source (62) and drain regions (64), and N enhanced drift regions (61), etc. The N enhanced drift regions (61, etc.) are more highly doped than the epitaxial layer (52) and extend between the drain regions and the gate (56) (with gate oxide 54). Metal strips (67, 68) are used to contact the rows of source (62) and drain (64) regions. The N enhanced drift regions (61) serve to significantly reduce on-resistance without significantly reducing breakdown voltage.

Regarding both U.S. Pat. Nos. 5,406,110 and 5,517,046, while the technique of lateral double diffusion with a differential dopant profile can create high voltage LDMOS devices with the following advantages:

No extra mask is needed, and
Device channel can be made very short and is self-aligned to the gate, the double diffusion process requires high temperature plus long diffusion time to drive dopants into the body region and is thus undesirable as it affects the wafer property. More specifically, using double lateral diffusion to create short-channel requires a high temperature around 1100 deg C. and long drive-in time of the order of an hour, as opposed to an LVCMOS (low voltage CMOS) process with temperature less than 950 deg C. As a result, the double diffusion process causes certain undesirable material property changes from the LVCMOS process. In the art, the associated limitation on diffusion temperature and time is called thermal budget. Additionally, without adding an extra polysilicon layer, the LDMOS process is not compatible with a popular industry standard sub-micron CMOS process.

In the following prior art paper:
Title: Complementary LDMOS transistors for a CMOS/BiCMOS process
Authors: S. Whiston, D. Bain, A. Deignan, J. Pollard, C. Ni Chleirigh, C. Musgrave, M. O'Neill
Analog Devices, Raheen Industrial Estate, Limerick, Ireland
Publication:
Power Semiconductor Devices and ICs, 2000. Proceedings. The 12th International Symposium on Semiconductor Devices, pages 51-54
Publication Date: 2000
Meeting Date: May 22, 2000-May 25, 2000
Location: Toulouse, France
ISBN: 0-7803-6269-1
INSPEC Accession Number: 6734962
Digital Object Identifier: 10.1109/ISPSD.2000.856771
as illustrated in FIG. 3A and FIG. 3B, a method of using multiple implants that are self-aligned to the poly gate edge to form an LDMOS is described. This method allows implementation of complementary LDMOS devices onto existing CMOS/BiCMOS processes without the addition of any thermal treatments thereby having no effect on the existing CMOS/BiCMOS device performance. This approach gives greater flexibility in controlling the body doping profile in the lateral and vertical directions enabling threshold voltage (Vt)

and breakdown voltage (BV) optimization for a wide range of source junctions that exist in many intrinsic and foundry processes. It is observed that Whiston et al used large angle tilt implant (LATID), where the implant tilt angle can be up to 45 degrees, to define the short channel body. It is further pointed out that the LATID does have the following disadvantages:

- Need refractory metal to stop excessive penetration of body implant through the gate
- Sensitivity of channel length to thickness variations of the gate stack
- Shadowing effects from source window opening causing undesirable deviation of the body implant profile
- Low ruggedness of device due to constraints on body implant dose for threshold voltage control Hence, further improvements are desirable to make ultra short channel lateral MOSFETs with correspondingly reduced on-resistance without using either the double diffusion process or the large angle tilt implant (LATID).

SUMMARY OF THE INVENTION

A short channel Lateral MOSFET (LMOS) is proposed with interpenetrating drain-body protrusions (IDBP). The short channel LMOS with IDBP includes:

A lower device bulk layer of first conductivity type lying in a horizontal plane.

An upper source region and an upper drain region both of first conductivity type and both located atop the lower device bulk layer.

Both the upper source region and the upper drain region are in contact with an intervening upper body region of second conductivity type that is also located atop the lower device bulk layer.

Both the upper drain region and the upper body region are further shaped to form a drain-body interface between them. The drain-body interface has an IDBP structure along a vertical plane with a surface drain protrusion lying atop a buried body protrusion while revealing a pre-determined top body surface area of the upper body region.

A gate oxide-gate electrode bi-layer disposed atop the upper body region while covering at least its top body surface area thus forming an LMOS with a short channel length defined by the horizontal length of the top body surface area delineated between the upper source region and the upper drain region.

An upper body-contact region of a second conductivity type in body contact with the upper body region and shaped to reveal a sufficient top surface area for making electrical contact with an external body contact electrode. The portion of upper body region between the upper source region and the upper drain region extends downwardly deeper than the upper source region and the upper drain region hence forming the body contact between the upper body region and the upper body-contact region.

Thus, in addition to having a reduced channel-on resistance corresponding to the short channel length, owing to the presence of the IDBP structure causing a correspondingly reduced surface electric field along the channel length the short channel LMOS exhibits a higher drain-source punch-through voltage than an otherwise short channel LMOS without the IDBP.

The upper drain region of the short channel LMOS with IDBP can further include a number of serially connected drain sub-regions all of a first conductivity type and arranged predominantly along the horizontal direction. The drain sub-regions have:

A first drain sub-region in contact with the upper body region and shaped, in conjunction with the upper body region, to form the IDBP. The first drain sub-region can also be a portion of the lower device bulk layer that gets separated there from by the presence of the buried body protrusion.

A last drain sub-region, most distant to the upper body region, shaped to reveal a sufficient top surface area for making electrical contact with an external drain contact electrode.

In an embodiment, the first conductivity type is N-type and the second conductivity type is P-type. In an alternative embodiment, the first conductivity type is P-type and the second conductivity type is N-type.

In a specific embodiment, the channel length ranges from about 0.2 micron to about 0.5 micron.

A short channel Lateral MOSFET (LMOS) is proposed with interpenetrating channel-body protrusions (ICBP). The short channel LMOS with ICBP includes:

A lower device bulk layer of first conductivity type lying in a horizontal plane.

A serially connected upper source region, upper channel region and upper drain region all of first conductivity type and all located atop the lower device bulk layer.

All the upper source region, upper channel region and upper drain region are in contact with an intervening upper body region of second conductivity type that is also located atop the lower device bulk layer.

Both the upper channel region and the upper body region are further shaped to form a channel-body interface between them. The channel-body interface has an ICBP structure along a vertical plane with the upper channel region lying atop a buried body protrusion while bridging the upper source region and the upper drain region with a channel depth defined by the depth of the channel-body interface.

A gate oxide-gate electrode bi-layer disposed atop while covering at least a top surface of the upper channel region thus forming an LMOS with a short channel length defined by the horizontal length of the top surface delineated between the upper source region and the upper drain region.

An upper body-contact region of a second conductivity type in body contact with the upper body region and shaped to reveal a sufficient top surface area for making electrical contact with an external body contact electrode. The portion of upper body region between the upper source region and the upper drain region extends downwardly deeper than the upper source region and the upper drain region hence forming the body contact between the upper body region and the upper body-contact region.

Thus, in addition to having a reduced channel-on resistance due to the short channel length, owing to the same conductivity type of the upper source region, upper channel region and upper drain region the short channel LMOS exhibits a threshold voltage whose value depends upon the channel depth. The threshold voltage further spans from that of an enhancement mode to a depletion mode MOS device. Additionally, owing to the presence of the ICBP structure causing a correspondingly reduced surface electric field along the channel length the short channel LMOS exhibits a higher drain-source punch-through voltage than an otherwise short channel LMOS without the ICBP.

The upper drain region of the short channel LMOS with ICBP can further include a number of serially connected drain sub-regions all of a first conductivity type and arranged predominantly along the horizontal direction. The drain sub-regions have:

A first drain sub-region in contact with the upper channel region and shaped, in conjunction with the upper body region, to form part of the ICBP. The first drain sub-region can also be a portion of the lower device bulk layer that gets separated there from by the presence of the buried body protrusion.

A last drain sub-region, most distant to the upper channel region, shaped to reveal a sufficient top surface area for making electrical contact with an external drain contact electrode.

A method is proposed for making a short channel LMOS device with interpenetrating drain-body protrusions (IDBP). The method includes:

a) Provide a partially fabricated semiconductor wafer oriented in a horizontal plane with:
   a1) A substrate and a lower device bulk layer of first conductivity type atop.
   a2) An upper body-contact region of second conductivity type and an upper drain region of first conductivity type, both located atop while being separated by the lower device bulk layer. The upper drain region has a pre-determined drain contact location and the upper body-contact region has a pre-determined body contact location.
   a3) A body-contact field oxide region atop the upper body-contact region for separating neighboring LMOS devices on the wafer.
   a4) A drain-gate field oxide region atop the upper drain region for separating the drain contact location from a gate structure.

b) Within the upper part of the lower device bulk layer, create an upper body region of second conductivity type. The upper body region has:
   b1) Its first lateral profile placed close to the upper drain region and shaped to form, together with the lower device bulk layer, a drain-body interface having an interpenetrating drain-body protrusion (IDBP) structure along a vertical plane with a surface drain protrusion lies atop a buried body protrusion while revealing a pre-determined top body surface area of the upper body region with the tip of the surface drain protrusion defining a first end of the LMOS channel length.
   b2) Its second lateral profile placed close to the upper body-contact region and overlapping with it.

c) Form the gate structure atop the revealed top body surface area and the drain-gate field oxide region with a first edge of the gate structure atop the drain-gate field oxide region and a second edge of the gate structure atop the revealed top body surface area and further spaced from the first end of the LMOS channel length by a pre-determined reference distance.

d) Create a drain contact zone of first conductivity type at the drain contact location and create an upper source region of first conductivity type atop the revealed top body surface area with a first end of the upper source region undercutting the second edge of the gate structure by a pre-determined undercut distance such that the first end of the upper source region defines a second end of the LMOS channel length with:

reference distance−undercut distance=the desired LMOS channel length.

e) Form device passivation layers atop the wafer, pattern the device passivation layers for external electrical contacts then form contact electrodes onto the drain contact zone, the source contact zone and at the body contact location.

For the creation of the upper body region of second conductivity type within the lower device bulk layer, the method includes ion implanting the lower device bulk layer with a number of type-2 ion implants. Each type-2 ion implant has its own implant energy, dosage and tilt angle. The method further calls for tilting at least one higher-energy type-2 implant by a sufficient tilt angle toward the upper drain region so as to form the IDBP structure.

To provide the partially fabricated semiconductor wafer with an upper drain region of first conductivity type, the method includes ion implanting the lower device bulk layer with a number of type-1 ion implants. Each type-1 ion implant has its own implant window, energy, dosage, tilt angle and post-implant dopant drive-in, jointly called an implant parameter set. The implant parameter sets are selected so as to result in a number of serially connected drain sub-regions all of first conductivity type and arranged predominantly along the horizontal direction with:

A first drain sub-region in contact with the upper body region.

A last drain sub-region, most distant from the upper body region, shaped to reveal a sufficient top surface area for making electrical contact with an external drain contact electrode.

The implant parameter sets are further selected so as to result in the first drain sub-region being a portion of the lower device bulk layer that gets separated there from by the presence of the buried body protrusion.

To form the gate structure atop the revealed top body surface area and the drain-gate field oxide region, the method further includes forming and patterning a gate oxide-gate electrode bi-layer thereon.

To provide the partially fabricated semiconductor wafer with a substrate and a lower device bulk layer of first conductivity type atop, the method further includes providing a substrate of second conductivity type, ion implanting a barrier layer of first conductivity type with a type-1 ion implant using an implant parameter set then epitaxially growing the lower device bulk layer atop the barrier layer.

A method is proposed for making a short channel LMOS device with inter-penetrating channel-body protrusions (ICBP). The method includes:

a) Provide a partially fabricated semiconductor wafer oriented in a horizontal plane with:
   a1) A substrate and a lower device bulk layer of first conductivity type atop.
   a2) An upper body-contact region of second conductivity type and an upper drain region of first conductivity type, both located atop while being separated by the lower device bulk layer with the interface between the upper drain region and the lower device bulk layer defining a first end of a channel length. The upper drain region has a pre-determined drain contact location and the upper body-contact region has a pre-determined body contact location.
   a3) A body-contact field oxide region atop the upper body-contact region for separating neighboring LMOS devices on the wafer.
   a4) A drain-gate field oxide region atop the upper drain region for separating the drain contact location from a gate structure.

b) Within the upper part of the lower device bulk layer, create an upper body region of second conductivity type. The upper body region has:
   b1) Its top profile recessed, by an amount defining a channel depth, from the top surface of the lower device bulk layer defining an upper channel region of first conductivity type.
   b2) Its first lateral profile placed next to the upper drain region and shaped to form, together with the lower device bulk layer, a channel-body interface there between having the ICBP structure along a vertical plane with the upper channel region lying atop a buried body protrusion while bridging the upper body-contact region and the upper drain region.
   b3) Its second lateral profile placed next to the upper body-contact region and overlapping with it.
c) Form the gate structure atop the upper channel region and the drain-gate field oxide region with a first edge of the gate structure atop the drain-gate field oxide region and a second edge of the gate structure atop the upper channel region and further spaced from the first end of the channel length by a pre-determined reference distance.
d) Create a drain contact zone of first conductivity type at the drain contact location and create a source contact zone of first conductivity type atop the upper body region with a first end of the source contact zone undercutting the second edge of the gate structure by a pre-determined undercut distance such that the first end of the source contact zone defines a second end of the channel length with:

reference distance−undercut distance=the desired LMOS channel length.

e) Form device passivation layers atop the wafer, pattern the device passivation layers for external electrical contacts then form contact electrodes onto the drain contact zone, the source contact zone and at the body contact location.

For the creation of the upper body region of second conductivity type within the lower device bulk layer, the method further includes ion implanting the lower device bulk layer with a number of type-2 ion implants. Each type-2 ion implant has its own implant energy, dosage and tilt angle. The method further calls for:
1. Tilt at least one higher-energy type-2 implant by a sufficient tilt angle toward the upper drain region so as to form the ICBP structure.
2. Use sufficiently high level of implant energy for the numerous type-2 ion implants so as to insure the top profile of the upper body region is recessed from the top surface of the lower device bulk layer by the channel depth.

To provide the partially fabricated semiconductor wafer with an upper drain region of first conductivity type, the method includes ion implanting the lower device bulk layer with a number of type-1 ion implants. Each type-1 ion implant has its own implant window, energy, dosage, tilt angle and post-implant dopant drive-in, jointly called an implant parameter set. The implant parameter sets are selected so as to result in a number of serially connected drain sub-regions all of first conductivity type and arranged predominantly along the horizontal direction with:

A first drain sub-region in contact with the upper body region.
A last drain sub-region, most distant from the upper body region, shaped to reveal a sufficient top surface area for making electrical contact with an external drain contact electrode.

The implant parameter sets are further selected so as to result in the upper channel region being a portion of the lower device bulk layer that gets separated there from by the presence of the buried body protrusion.

To form the gate structure atop the upper channel region and the drain-gate field oxide region, the method further includes forming and patterning a gate oxide-gate electrode bi-layer thereon.

To provide the partially fabricated semiconductor wafer with a substrate and a lower device bulk layer of first conductivity type atop, the method further includes providing a substrate of second conductivity type, ion implanting a barrier layer of first conductivity type with a type-1 ion implant using an implant parameter set then epitaxially growing the lower device bulk layer atop the barrier layer.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative:

FIG. 4-FIG. 9, FIG. 11 and FIG. 12-FIG. 15A illustrate the overall process of fabricating the short channel LMOS device of the present invention;

FIG. 10A and FIG. 10B illustrate some selected implant parameters of an ion implantation process that is a critical part of the overall fabrication process;

FIG. 15B illustrates an enlarged detail of the channel area of a short channel LMOS device with interpenetrating drain-body protrusions under the present invention; and FIG. 16 illustrates another short channel LMOS device with interpenetrating channel-body protrusions having a buried upper body region of second conductivity type under the present invention.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 1:
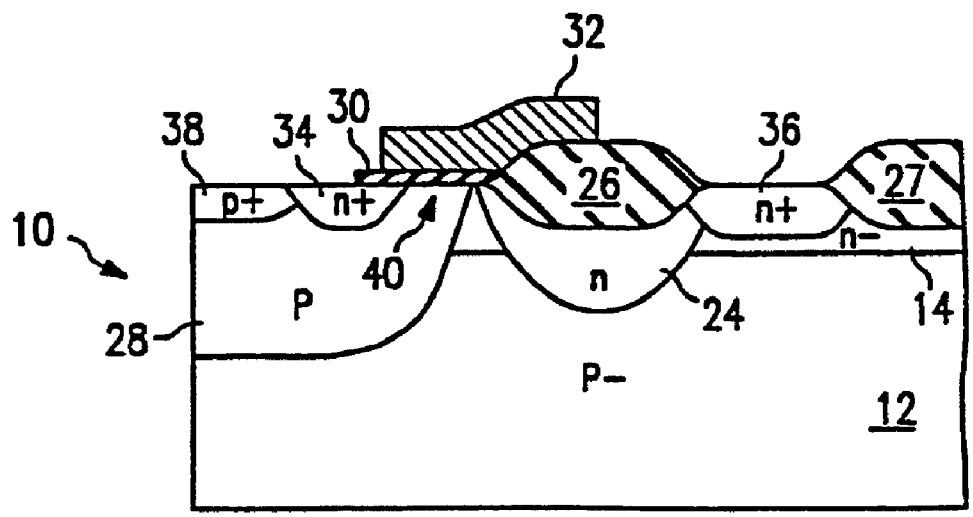
FIG. 1 illustrates a lateral double diffused insulated gate field effect transistor (LDMOS) with reduced surface field (RESURF) by Kwon, et al in U.S. Pat. No. 5,406,110.
Figure 2:
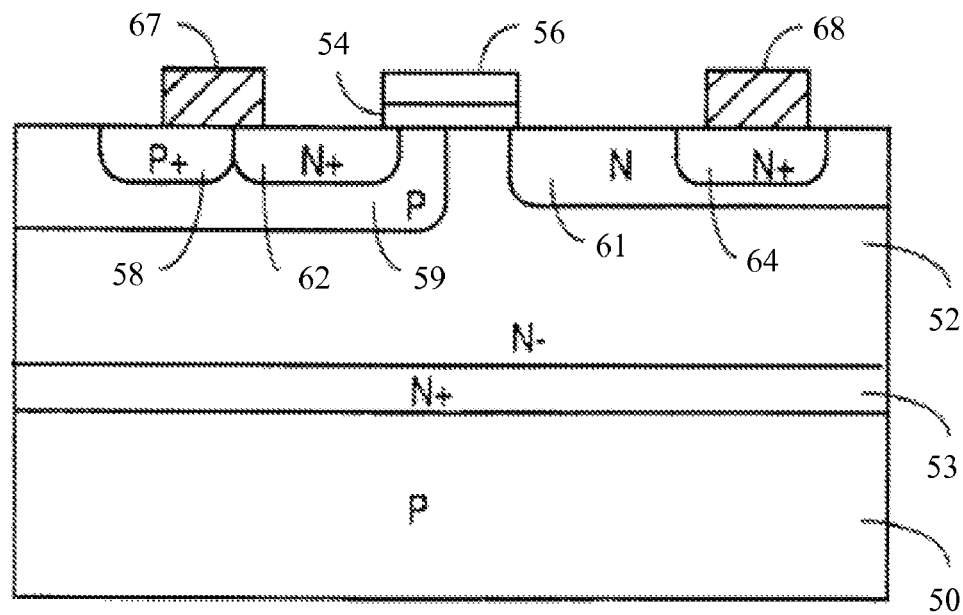
FIG. 2 illustrates a high voltage lateral DMOS (LDMOS) device with enhanced drift region by Hsing, et al in U.S. Pat. No. 5,517,046.
Figure 3A:
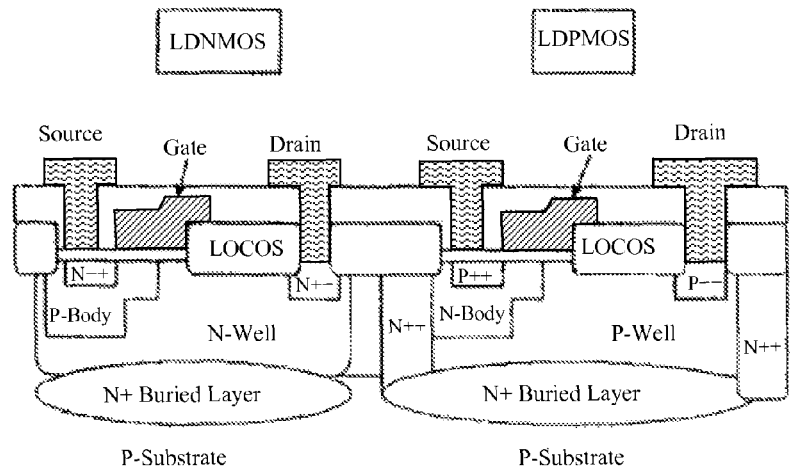
FIG. 3A and FIG. 3B illustrate a method of using multiple implants self-aligned to the poly gate edge to form an LDMOS in a prior art paper entitled "Complementary LDMOS transistors for a CMOS/BiCMOS process" by S. Whiston et al.
Figure 3B:
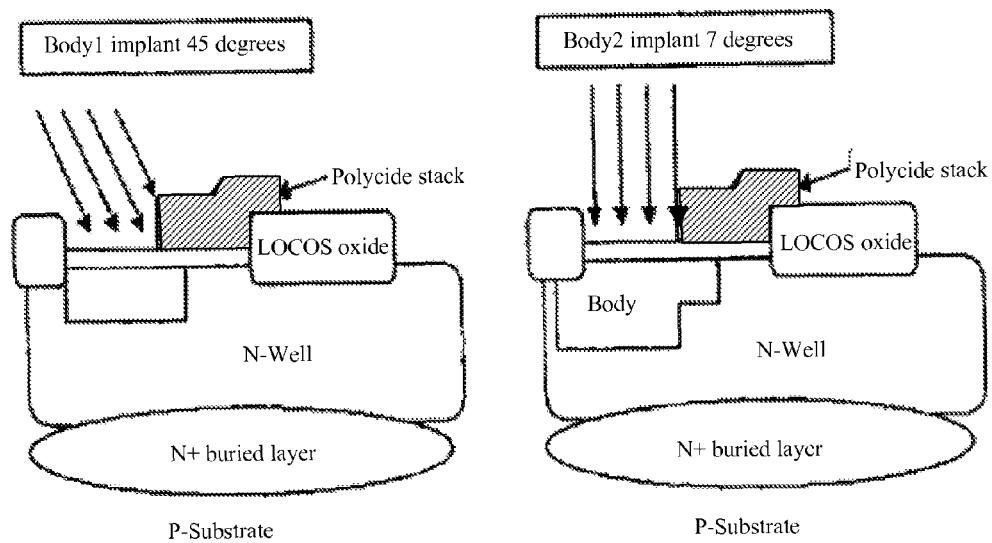
Figure 4:
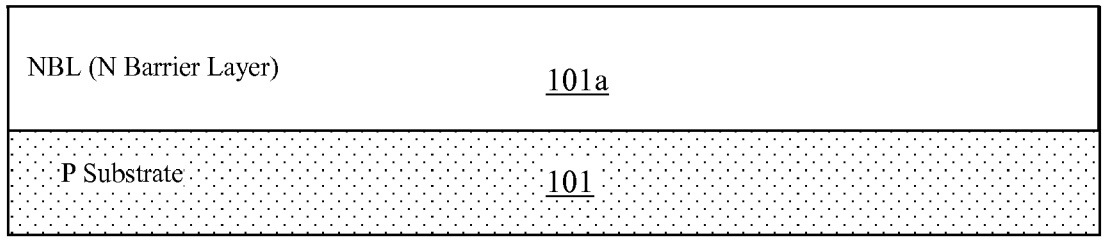

To simplify the graphical presentation of the fabrication process for the short channel LMOS device, the following convention of abbreviation known in the art is employed:
LV well implant=an implanted well for low voltage devices
HV well implant=an implanted well for high voltage devices
LVNW=an N-type well region for low voltage devices
LVPW=a P-type well region for low voltage devices
HVNW=an N-type well region for high voltage devices
HVPW=a P-type well region for high voltage devices
LPCVD=low pressure chemical vapor deposition FIG. 4-FIG. 9, FIG. 11 and FIG. 12-FIG. 15A illustrate the overall process of fabricating the short channel LMOS device of the present invention. Thus, FIG. 4 illustrates the result of the following process steps:

Starting with a P-type substrate 101, through a mask form an N-type barrier layer (NBL) 101a with an N-type ion implant. In the art, the ion implantation process has an associated implant parameter set that includes implant window as defined by a mask, implant ion, implant energy, ion dosage flux, beam tilt angle (with respect to a normal axis of the P-type substrate 101) and/or post-implant dopant drive-in, etc. In this case:
mask=plasma photo resist (PR) strip, implant ion=antimony (Sb), implant energy=40 keV, ion dosage flux=$2.0 \times 10^{15}$ ions/cm$^2$, Tilt angle=7 degrees, post-implant dopant drive-in=900 Deg C. wet oxide growth to 550 angstrom then annealed in nitrogen environment @ 1200 Deg for 30 minutes Optionally while not shown here, a P-type barrier layer (PBL) can also be similarly formed with a P-type dopant ion for building CMOS devices on the same chip.

Figure 5:
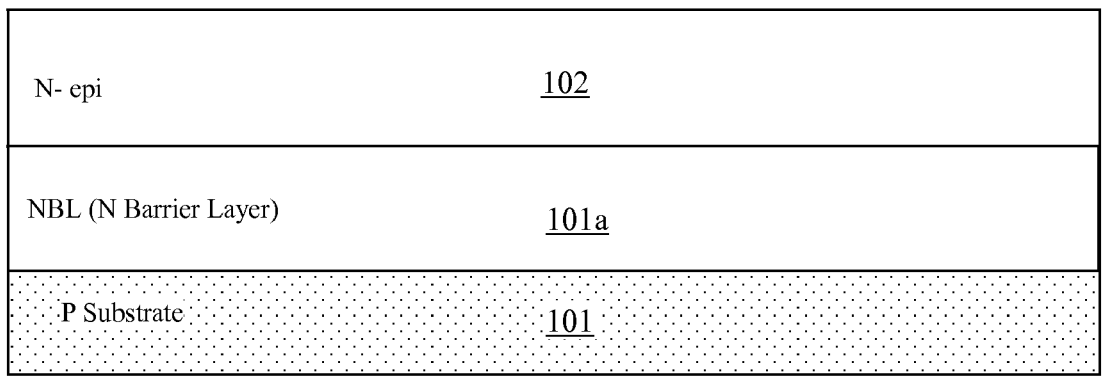

Next, FIG. 5 illustrates the result of the following process steps:
Pre-epitaxial clean and silicon etch of the wafer
Epitaxial (EPI) growth of N-type lower device bulk layer 102: 1130 Deg C., EPI thickness=5+/−0.3 micron, EPI resistivity=3+/−0.2 Ohm-cm, dopant concentration=$1.5 \times 10^{15}$/cm$^3$ phosphorus A remark concerning FIG. 4 and FIG. 5: While the currently illustrated process forms the N barrier layer 101a (and optionally a PBL for CMOS devices) before the EPI growth, the NBL/PBL can alternatively be formed by ion implant after the EPI growth.

Figure 6:
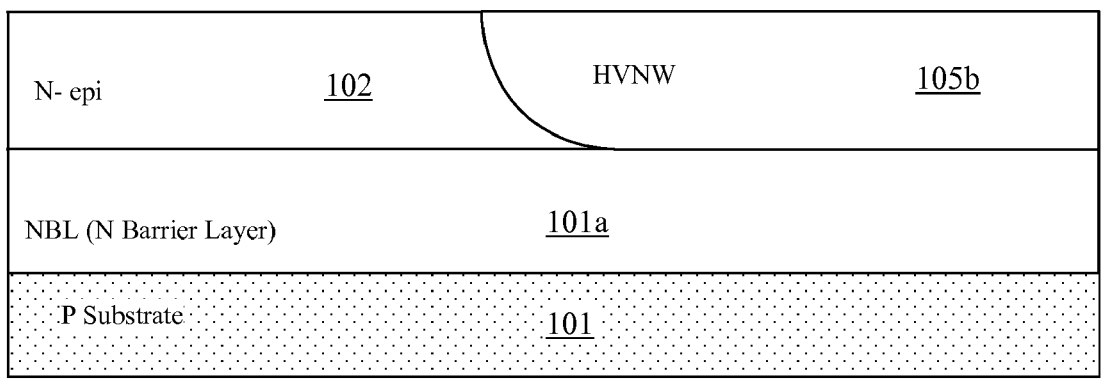
Figure 7:
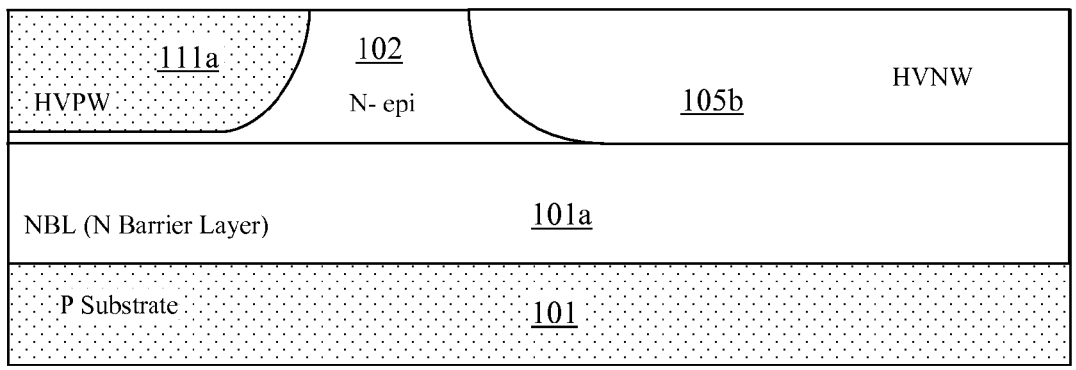
Figure 8:
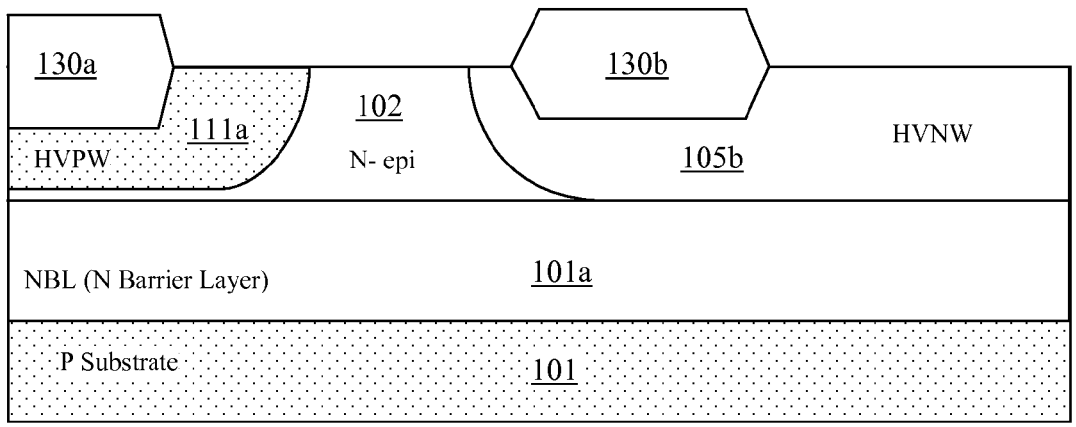
Figure 9:
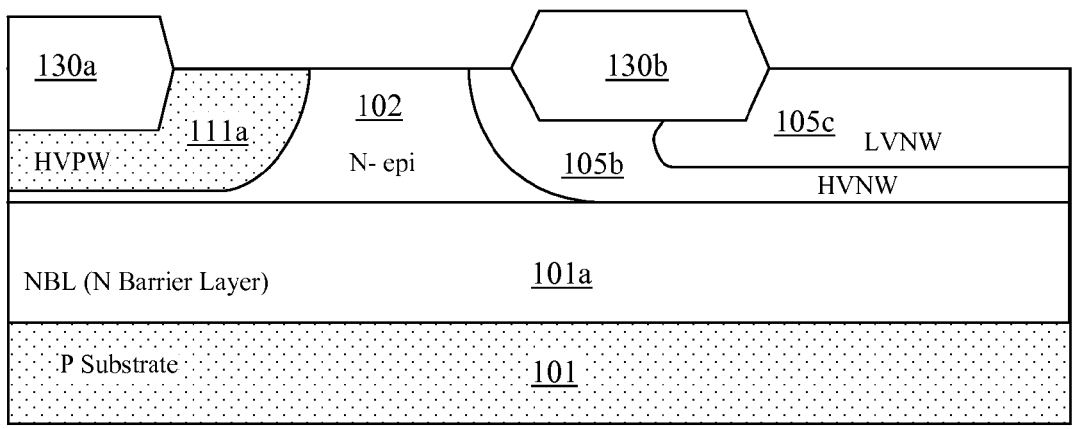

Next, FIG. 6 illustrates the result of the following process steps:
Positive PR coating, HVNW mask patterning
N-type ion implant to form second N-type drain sub-region 105b with:
mask=HVNW mask, implant ion=phosphorus, implant energy=150 keV, ion dosage flux=$3 \times 10^{12}$ ions/cm$^2$, Tilt angle=0 degree, post-implant dopant drive-in=1175 Deg C. in nitrogen environment for 60 minutes Next, FIG. 7 illustrates the result of the following process steps:
Positive PR coating, HVPW mask patterning
P-type ion implant to form first P-type upper body-contact region 111a with: mask=HVPW mask, implant ion=boron, implant energy=80 keV, ion dosage flux=$8 \times 10^{12}$ ions/cm$^2$, Tilt angle=0 degree, post-implant dopant drive-in=1100 Deg C. in nitrogen environment for 110 minutes Next, FIG. 8 illustrates the result of the following process steps:
Wet-thermal oxide growth @ 900 Deg C. to thickness=300±30 Angstrom
LPCVD of SiN to 1800±140 Angstrom
KrF PR Coating
FIELD oxide mask
SiN Etching
1100 C wet-field oxide growth of body-contact field oxide region 130a and drain-gate field oxide region 130b by thermal oxidation to 4800±250 Angstrom
Nitride wet stripping Next, FIG. 9 illustrates the result of the following process steps:
Positive PR coating, LVNW mask patterning
Chain of ion implants to form third N-type drain sub-region 105c with:
1. Implant ion=phosphorus+, implant energy=700 keV, ion dosage flux=$1.5 \times 10^{13}$ ions/cm$^2$, Tilt angle=7 degree
2. Implant ion=phosphorus, implant energy=250 keV, ion dosage flux=$2 \times 10^{12}$ ions/cm$^2$, Tilt angle=0 degree
3. Implant ion=arsenic, implant energy=260 keV, ion dosage flux=$4 \times 10^{12}$ ions/cm$^2$, Tilt angle=0 degree
4. Implant ion=boron+, implant energy=30 keV, ion dosage flux=$8.5 \times 10^{12}$ ions/cm$^2$, Tilt angle=0 degree Notice a feature of left-pointing protrusion is created at the lower left corner of the third N-type drain sub-region 105c. This protrusion is created by using a tilt angle of 7 degrees toward the drain-gate field oxide region 130b for the first ion implant above having the highest implant energy of 700 keV.

Continuing with the description of the overall process of fabricating the short channel LMOS device, referring now to FIG. 11 that illustrates the result of the following process steps:
Positive PR coating, LVPW mask patterning
Chain of ion implants (implant-A through implant-D) to form a P-type upper body region 110 with:
A. Implant ion=boron+, implant energy=300 keV, ion dosage flux=$2 \times 10^{13}$ ions/cm$^2$, Tilt angle=7 degree
B. Implant ion=boron+, implant energy=100 keV, ion dosage flux=$4 \times 10^{12}$ ions/cm$^2$, Tilt angle=0 degree
C. Implant ion=boron+, implant energy=60 keV, ion dosage flux=$2 \times 10^{12}$ ions/cm$^2$, Tilt angle=0 degree
D. Implant ion=boron+, implant energy=30 keV, ion dosage flux=$1.9 \times 10^{12}$ ions/cm$^2$, Tilt angle=0 degree Notice a protrusion pointing to the left is created at the lower left corner of the third N-type drain sub-region 105c. This protrusion is created by using a tilt angle of 7 degrees toward the drain-gate field oxide region 130b for the above first ion implant having the highest implant energy of 700 keV.

Notice the left lateral profile of the P upper body region 110 is placed close to the first P upper body-contact region 111a and overlapping therewith. More importantly, an interpenetrating drain-body protrusions (IDBP) structure along a vertical plane is also formed at the juncture of three regions: right side of P upper body region 110, top portion of N− lower device bulk layer 102 and left side of second N drain sub-region 105b. More particularly, the IDBP structure has a surface drain protrusion 112 lying atop a buried body protrusion 113 while revealing a pre-determined top body surface area 114 of the P upper body region 110. Also, the surface drain protrusion 112 becomes a portion of a newly formed first N drain sub-region 105a that used to be a portion of the N− lower device bulk layer 102 but then the first N drain sub-region 105*a* gets separated from the N− lower device bulk layer 102 by the presence of the buried body protrusion 113.

Turning now to FIG. 10A and FIG. 10B for a more detailed illustration of some selected implant parameters of the various ion implantation processes of the present invention. A semiconductor wafer 80 has a wafer notch 80*a* for marking its crystallographic orientation. FIG. 10A is a perspective view of the semiconductor wafer 80 approximating a side view while FIG. 10B is a top view of the semiconductor wafer 80. The implant direction of an ion-implant vector 83, being the direction of the implanting ions, is quantified by a tilt angle α that is the subtended angle between the ion-implant vector 83 and a wafer normal axis 81 perpendicular to a wafer in-plane axis 82. The implant crystallographic orientation, being the direction of the implanting ions with respect to the wafer crystallographic orientation notch 80*a*, is quantified by a an orientation angle β that is the subtended angle between the ion-implant vector 83 and a wafer radius through the wafer notch 80*a*. However, to insure that implant cases with a non-zero tilt angle α will produce the same semiconductor device regardless of its location on the semiconductor wafer 80 as referred to the orientation angle β, a planetary wafer rotation is, as illustrated, usually simultaneously carried on through a wafer chuck during the implant process. As part of the implant parameters, the following is also defined:

Type-1 ion implant creates a region of first conductivity type within the semiconductor wafer 80.

Type-2 ion implant creates a region of second conductivity type within the semiconductor wafer 80.

Where type-1 and type-2 simply refer to implant dopants of opposite types. For example, when type-1 is N-type then type-2 is P-type and vice versa.

Figure 11A:
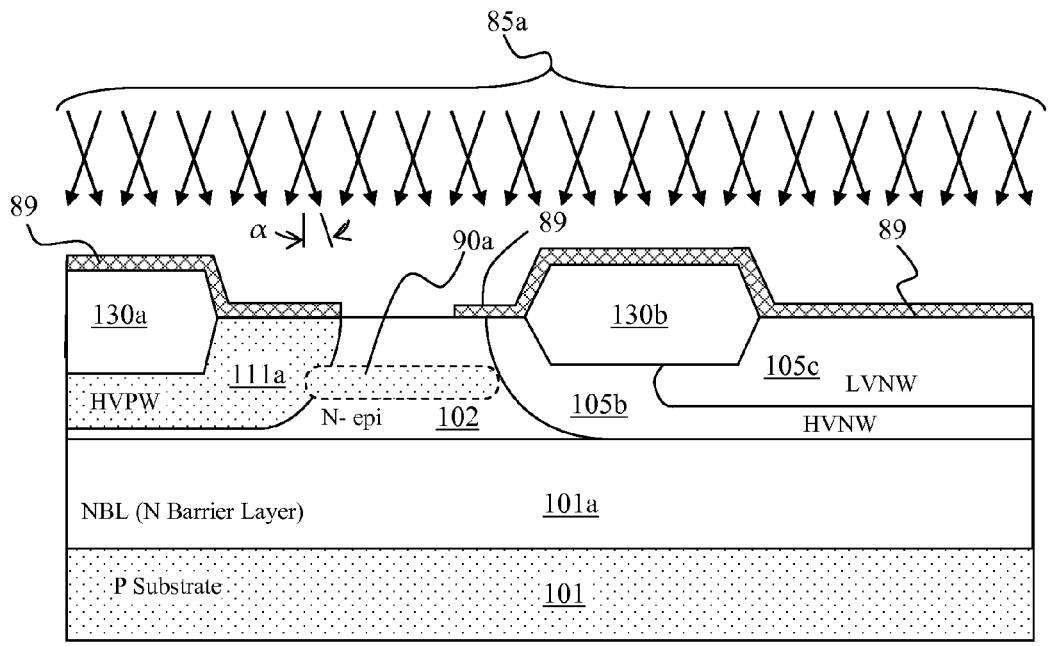
FIG. 11A-FIG. 11E are step-by-step illustration of a sequenced number of type-2 ion implants for the creation of an upper body region of second conductivity type within a lower device bulk layer.

FIG. 11A through FIG. 11E are step-by-step illustration of the above sequence of type-2 ion implants (implant-A through implant-D) for the creation of the P upper body region 110 of second conductivity type within the N− lower device bulk layer 102. FIG. 11A illustrates the result from implant-A. Through a pre-formed and patterned implant resist 89, ion-implant flux 85*a* of boron+ with an implant energy of 300 keV and at a tilt angle α of 7 degrees produced an implanted ion pocket 90*a* buried within the N− lower device bulk layer 102. Notice the effect of an accompanying planetary wafer rotation resulted in the implanted ion pocket 90*a* undercutting the implant resist 89 window at all its edges.

Figure 11B:
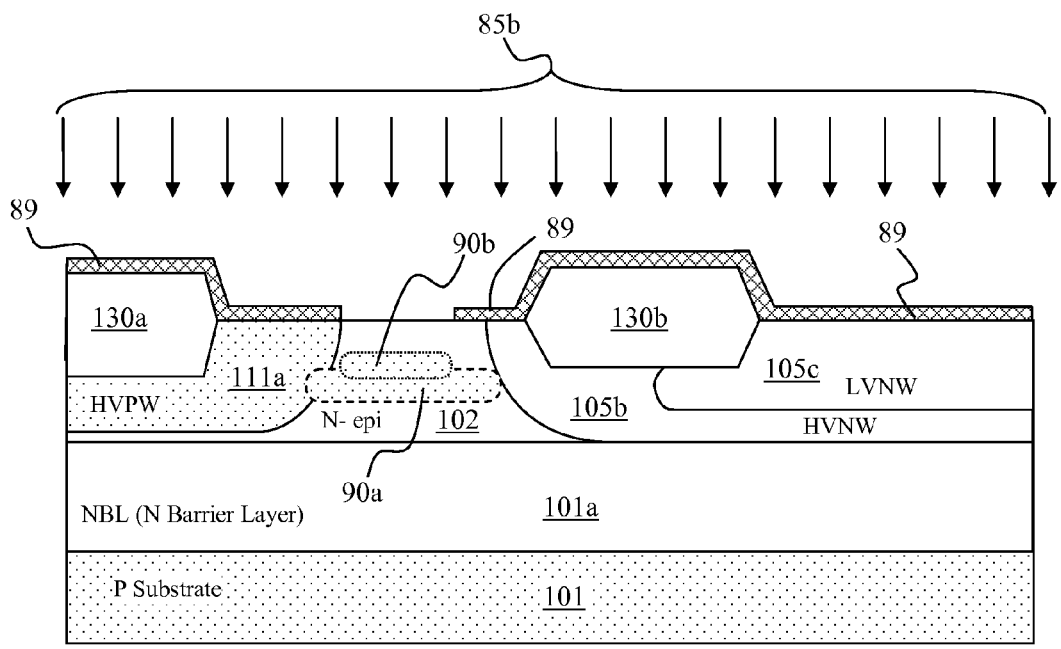

FIG. 11B illustrates the result from implant-B. Through the implant resist 89, ion-implant flux 85*b* of boron+ with an implant energy of 100 keV and at a tilt angle of 0 degree produced an implanted ion pocket 90*b* atop and overlapping the implanted ion pocket 90*a* while still buried within the N− lower device bulk layer 102. With a tilt angle of 0 degree, the implanted ion pocket 90*b* has essentially no undercut at the edges of the implant resist 89 window.

Figure 11C:
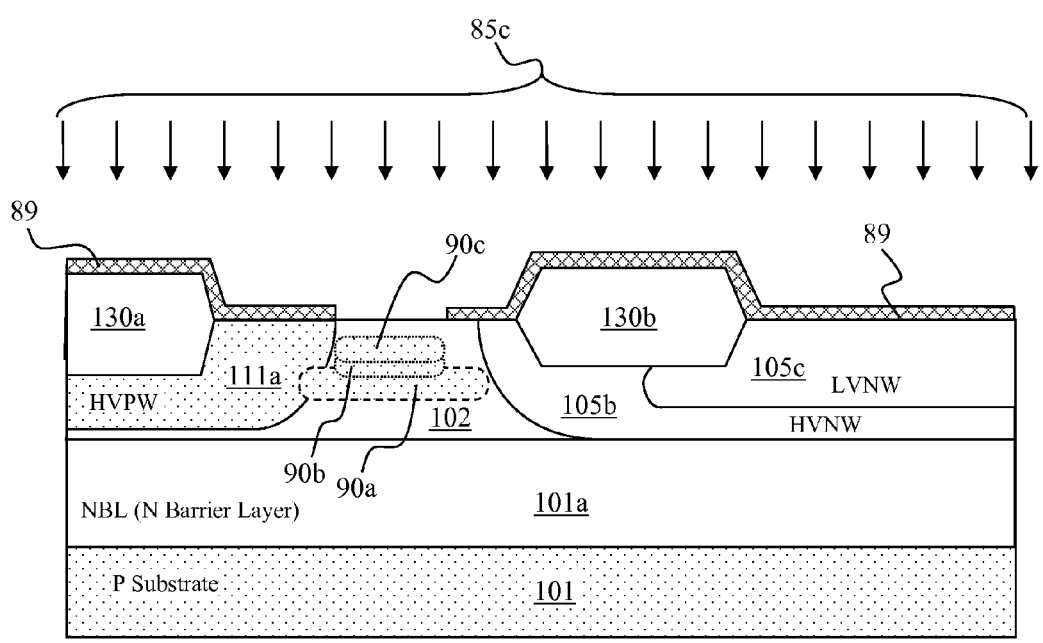

FIG. 11C illustrates the result from implant-C. Through the implant resist 89, ion-implant flux 85*c* of boron+ with an implant energy of 60 keV and at a tilt angle of 0 degree produced an implanted ion pocket 90*c* atop and overlapping the implanted ion pocket 90*b* while still buried within the N− lower device bulk layer 102. With a tilt angle of 0 degree, the implanted ion pocket 90*c* has essentially no undercut at the edges of the implant resist 89 window.

Figure 11D:
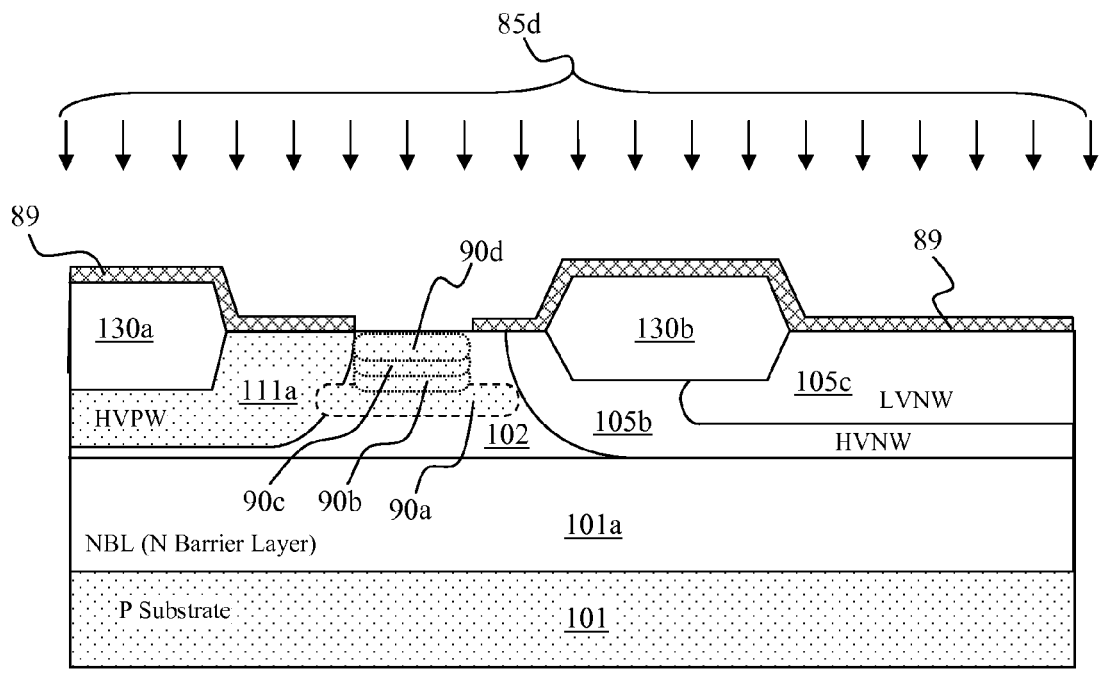
Figure 11E:
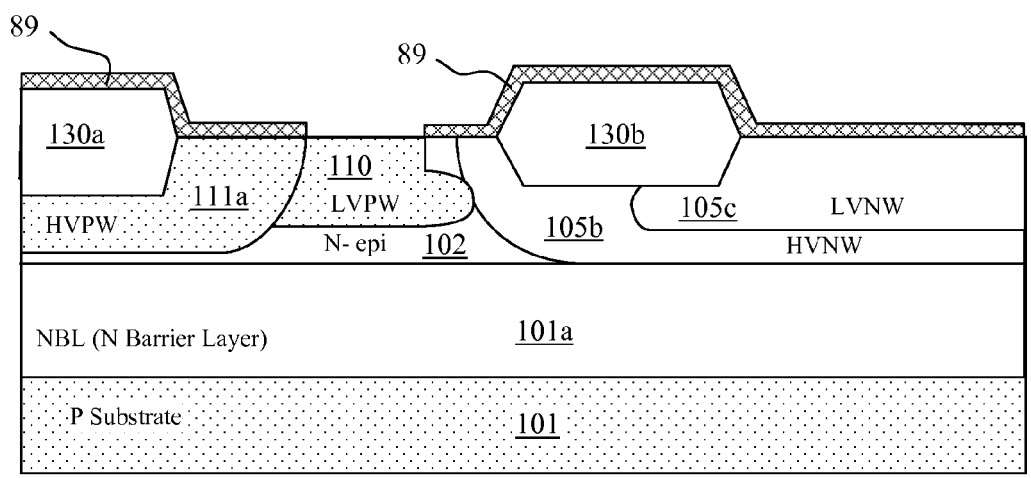

FIG. 11D illustrates the result from implant-D. Through the implant resist 89, ion-implant flux 85*d* of boron+ with an implant energy of 30 keV and at a tilt angle of 0 degree produced an implanted ion pocket 90*d* atop and overlapping the implanted ion pocket 90*c* but now located at the surface of the N− lower device bulk layer 102. With a tilt angle of 0 degree, the implanted ion pocket 90*d* has essentially no undercut at the edges of the implant resist 89 window. Thus, with the controlled overlapping of the various implanted ion pockets 90*a* through 90*d*, they jointly form the desired P upper body region 110 and this is illustrated in FIG. 11E before the implant resist 89 gets stripped off. It is important to summarize that, while creating the P upper body region 110 of second conductivity type involves ion implanting the N− lower device bulk layer 102 with numerous type-2 ion implants each having its own implant energy, dosage and tilt angle, it is important to tilt at least one higher-energy type-2 implant (such as implant-A) by a sufficient tilt angle (such as 7 degrees) toward the second N drain sub-region 105*b* so as to form the IDBP structure. Other than this method, formation of the IDBP structure can be easily transferred to other semiconductor wafer processing technologies as no special equipment is needed here.

Figure 12:
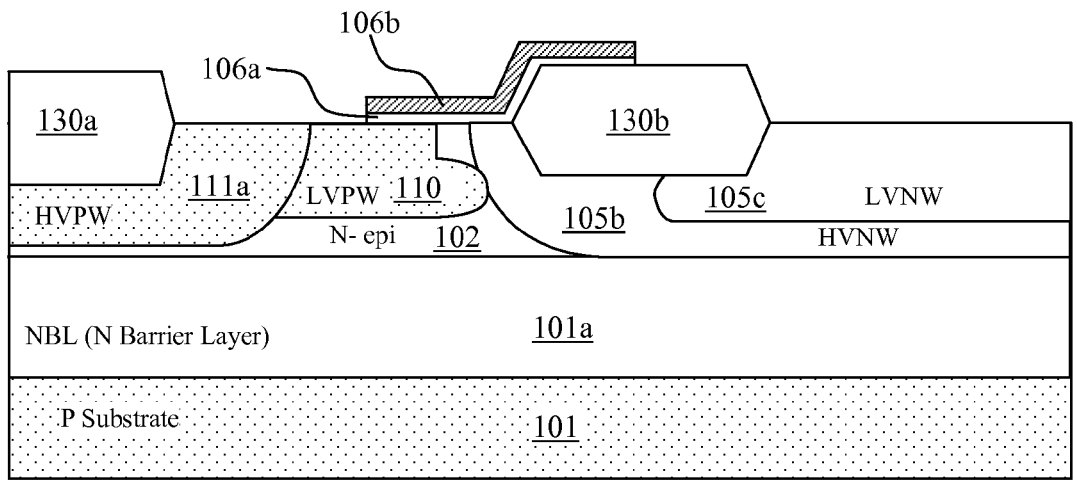
Figure 13:
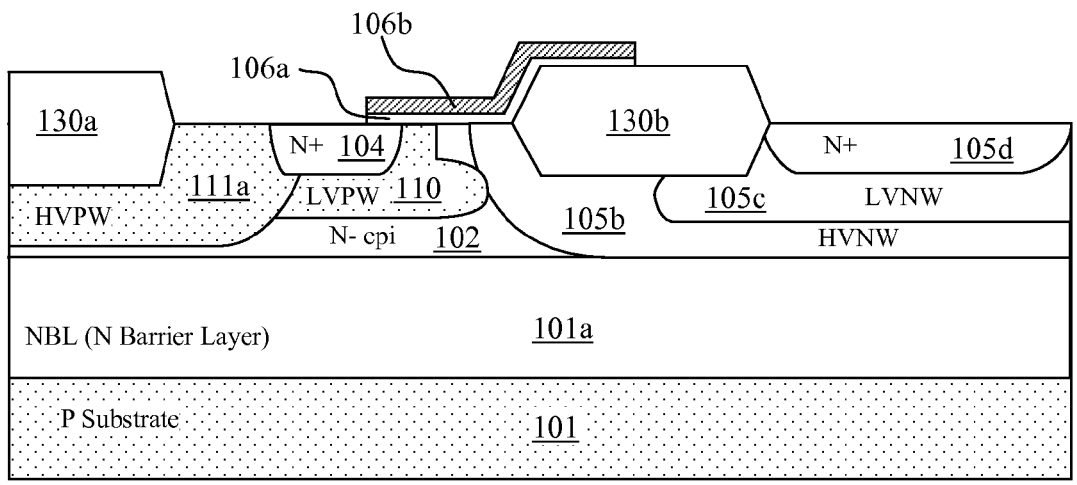

Continuing with the description of the overall process of fabricating the short channel LMOS device, referring now to FIG. 12 that illustrates the formation of a gate oxide 106*a*-polysilicon gate electrode 106*b* bi-layer gate structure following these process steps:

Stripping off implant resist 89
Gate oxide growth
Polysilicon gate electrode deposition
Positive PR Coating
KrF PR Coating
Gate masking
Gate etching Next, FIG. 13 illustrates the formation of:

1. A fourth N+drain sub-region 105*d* into and in electrical contact with the third N drain sub-region 105*c*. The fourth N+drain sub-region 105*d* is a drain contact zone of first conductivity type for later contact with a metallic drain electrode.
2. An N+ upper source region 104 of first conductivity type atop the revealed top body surface area 114 (FIG. 11). Notice the right edge of the N+ upper source region 104 undercuts the left edge of the bi-layer gate structure (106*a*, 106*b*). Also, the portion of the P upper body region 110 between the N+ upper source region 104 and the upper drain region (top tip portion of the N− lower device bulk layer 102) extends downwardly deeper than the N+upper source region 104 and the upper drain region hence forms a body contact between the P upper body region 110 and the first P upper body-contact region 111*a*.

Figure 14:
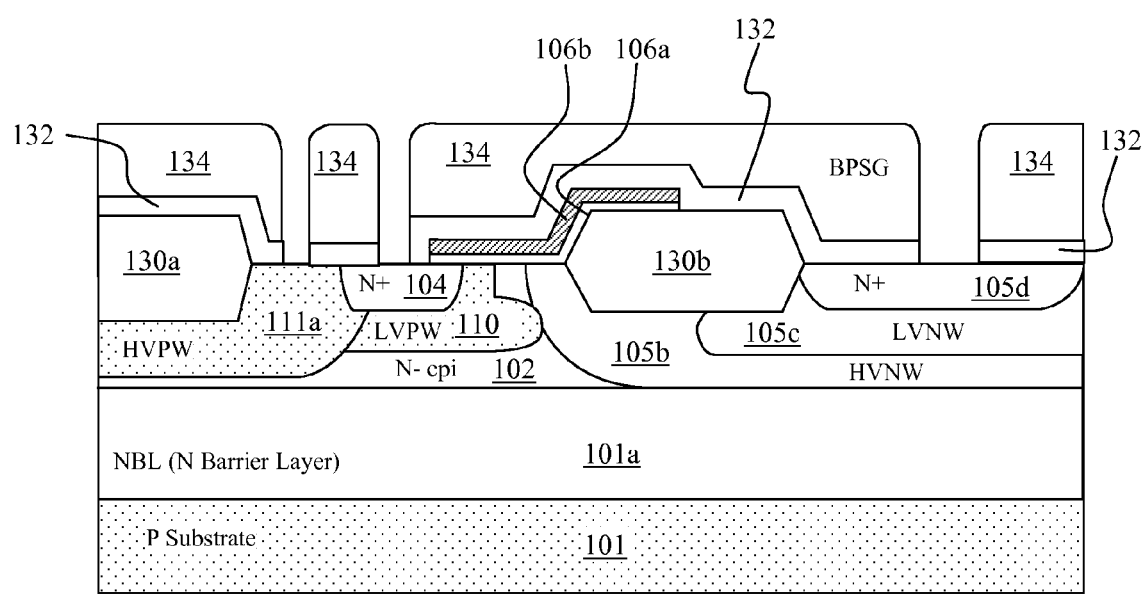

The above formation results from these process steps:

Positive PR Coating
Drain/source masking
Drain/source implant with a tilt angle (details not described here in view of earlier description of tilted implant flux)
Post-implant activation/thermal oxide growth Next, FIG. 14 illustrates the formation and patterning of device passivation layers CVD oxide 132 and BPSG 134 atop the wafer, as preparation for making external electrical contacts. The formation results from these process steps:

Oxide deposition with CVD

BPSG (borophosphosilicate glass) formation

Contact opening

Figure 15A:
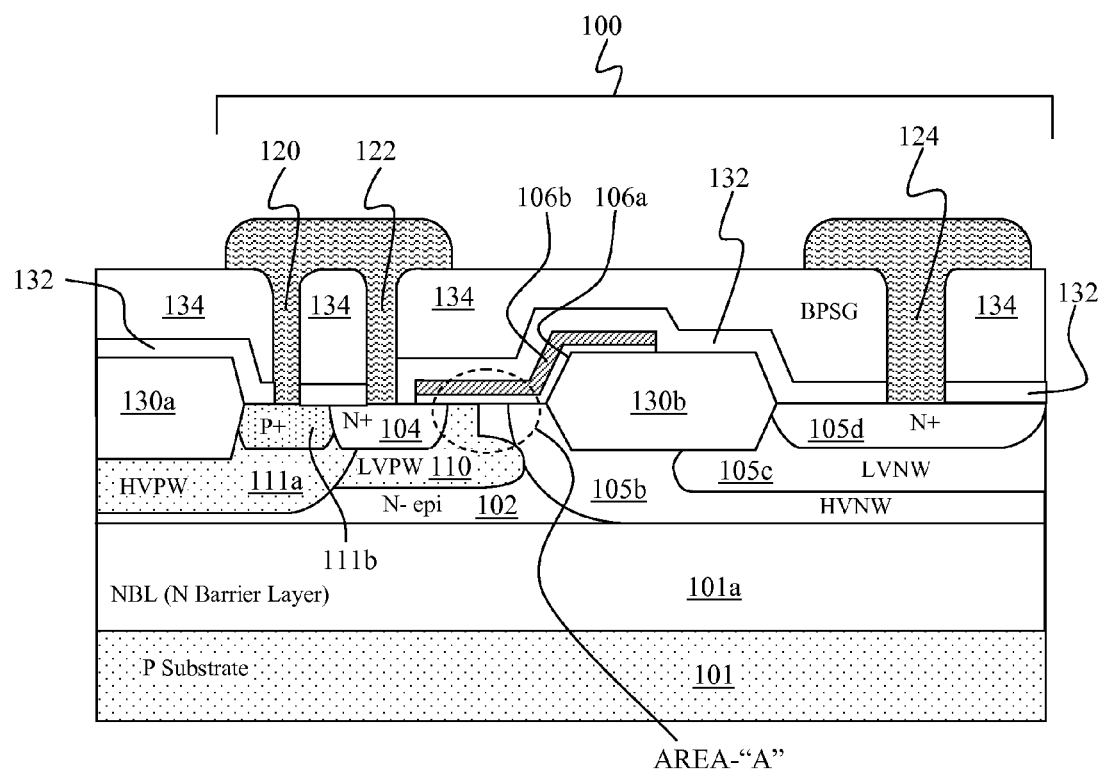

Finally, FIG. 15A illustrates the formation of external body contact electrode 120, external source contact electrode 122 and external drain contact electrode 124 following these process steps:

+Contact implant

Metal deposition (standard process)

This results in a short channel LMOS (Lateral MOSFET) with IDBP 100 of the present invention with its source and drain located atop the wafer substrate 101.

FIG. 15B together with FIG. 15A illustrate an enlarged detail of the channel area (AREA-"A" of FIG. 15A) of the short channel LMOS device 100 with IDBP under the present invention. The short channel LMOS with IDBP 100 has a channel length 107 defined by the horizontal length of the top body surface area 114 delineated between the N+ upper source region 104 and the first N drain sub-region 105a. Recall from FIG. 11 that the IDBP structure has a surface drain protrusion 112 and a buried body protrusion 113. Thus, the tip of the surface drain protrusion 112 defines a right end of the channel length 107. The right tip of the N+ upper source region 104, undercutting the left edge of the bi-layer gate structure (106a, 106b), defines a left end of the channel length 107. Or equivalently:

> LMOS channel length=[Distance between left edge of the gate structure and left tip of the first N drain sub-region 105a]−[amount of undercut of right edge of the N+ upper source region 104 into left edge of the gate structure]

As described, the present invention disclosed a short channel LMOS device manufacturable without using "high temperature PLUS long diffusion time" typically required of a traditional short channel LDMOS device. Under the present invention, a short channel length 107 from about 0.2 micron to about 0.5 micron can be made with a correspondingly reduced channel-on resistance. Furthermore, owing to the presence of the IDBP structure causing a correspondingly reduced surface electric field along the channel length 107 the short channel LMOS with IDBP exhibits a higher drain-source punch-through voltage than an otherwise short channel LDMOS without the IDBP. This is evidenced by the following TABLE-IA and TABLE-IB of tabulated sample data:

TABLE-IA

Traditional LDMOS

| Device ID. | Vgmax | Vdmax | L | Vt | BV | RdsAA |
|---|---|---|---|---|---|---|
| 1A | 5 | 40 | 0.8 | 0.592 | 47.395 | 69.17 |
| 2A | 5 | 40 | 0.6 | 0.560 | 42.590 | 65.11 |
| 3A | 5 | 40 | 0.4 | 0.494 | 44.422 | 61.95 |

TABLE-IB

Present Invention LMOS with IDBP Structure

| Device ID. | Vgmax | Vdmax | L | Vt | BV | RdsAA |
|---|---|---|---|---|---|---|
| 1B | 5 | 40 | 0.8 | 0.493 | 47.907 | 64.72 |
| 2B | 5 | 40 | 0.6 | 0.402 | 50.689 | 60.07 |
| 3B | 5 | 40 | 0.4 | 0.167 | 50.217 | 55.09 | where
L = channel length, micron
Vt = threshold voltage, Volt
BV = drain-source breakdown voltage, Volt
Vdmax = maximum drain voltage
Vgmax = maximum gate voltage
RdsAA = drain-source resistance × active area Numerous additional advantages of the present invention are as follows:

No extra mask and associated cost for making the short channel LMOS with IDBP

Minimal change to a standard CMOS process flow, a split table can be implemented for adjusting selected implant parameters within a single implant step The accuracy of currently available steppers (0.01-0.03 micron) is sufficient hence a dedicated self-aligned body implant can be eliminated FIG. 16 illustrates another short channel LMOS device 100 with interpenetrating channel-body protrusions (ICBP) having a buried P upper body region 110a of second conductivity type below an N− upper device bulk layer 108 under the present invention. The ICBP includes a surface channel protrusion 115 that is part of the N− upper device bulk layer 108 and a buried body protrusion 113 that is part of the buried P upper body region 110a. The N− upper device bulk layer 108 thus forms the channel of the short channel LMOS device 100. Notice that the N− upper device bulk layer 108 is a portion of the N− lower device bulk layer 102 but the N− upper device bulk layer 108 gets separated from the N− lower device bulk layer 102 by the presence of the buried body protrusion 113. Comparing with the IDBP of FIG. 15A, the ICBP of FIG. 16 distinguishes itself with the fact that the buried P upper body region 110a is totally buried below the device channel surface. The N− upper device bulk layer 108 thus bridges the N+ upper source region 104 and the second N drain sub-region 105b with a channel depth defined by the depth of the buried P upper body region 110a. Correspondingly, the channel length 107 is defined by the horizontal length of the top surface of N− upper device bulk layer 108 delineated between the N+ upper source region 104 and the second N drain sub-region 105b. Therefore, the resulting lateral path of "N+ upper source region 104-to-N+ upper device bulk layer 108-to-second N drain sub-region 105b" would normally only act as a straight low-resistance path. However, under proper combination of various regional dopant concentrations and burial depth of the buried P upper body region 110a it can still deplete the N− upper device bulk layer 108 of conductive electrons thus rendering the it non-conductive until sufficient positive voltage is applied to the polysilicon gate electrode 106b to induce sufficient electrons in the N− upper device bulk layer 108 to make it conductive— hence reflecting an MOSFET action without going through channel inversion. In essence, for those skilled in the art the short channel LMOS device 100 exhibits a threshold voltage whose value, depending upon the channel depth, can span from that of an enhancement mode to a depletion mode MOS device. Furthermore, owing to the presence of the ICBP structure causing a correspondingly reduced surface electric field along the channel length 107 the short channel LMOS device 100 with ICBP also exhibits a higher drain-source punch-through voltage than an otherwise short channel LMOS without the ICBP structure.

To those skilled in the art while comparing FIG. 11 with FIG. 16 and further referencing FIG. 11A through FIG. 11E, to make the totally buried P upper body region 110a within the N– lower device bulk layer 102, the ion implant process should:

1. Tilt at least one higher-energy type-2 implant by a sufficient tilt angle toward the second N drain sub-region 105b so as to form the ICBP structure.
2. Use sufficiently high level of implant energy for the numerous type-2 ion implants so as to insure the top profile of the buried P upper body region 110a is recessed from the top surface of the N– lower device bulk layer 102 by a desired channel depth.

While the description above contains many specificities, these specificities should not be constructed as accordingly limiting the scope of the present invention but as merely providing illustrations of numerous presently preferred embodiments of this invention. To those skilled in the art, it should become clear that the invention expects to be applicable to other types of semiconductor wafer substrate as well, such as Germanium (Ge), Silicon-Germanium (SiGe), Gallium-Arsenide (GaAs), etc.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. For example, although the present invention describes an LMOS device, the invention should be extendable to a short channel trench MOSFET with correspondingly low on-resistance and high punch-through voltage. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. A short channel Lateral MOSFET (LMOS) with interpenetrating channel-body protrusions (ICBP), the short channel LMOS with ICBP comprises:
    a lower device bulk layer of first conductivity type lying in a horizontal plane;
    a serially connected upper source region, upper channel region and upper drain region all of first conductivity type and all located atop said lower device bulk layer;
    said upper source region, upper channel region and upper drain region being in contact with an intervening upper body region of second conductivity type being also located atop said lower device bulk layer;
    said upper channel region and said upper body region are further shaped to form a channel-body interface there between having an ICBP structure along a vertical plane with the upper channel region lying atop a buried body protrusion while bridging the upper source region and the upper drain region with a channel depth defined by the depth of said channel-body interface; and
    a gate oxide-gate electrode bi-layer disposed atop while covering at least a top surface of the upper channel region thus forming an LMOS with a short channel length defined by the horizontal length of the top surface delineated between the upper source region and the upper drain region
    whereby, in addition to having a reduced channel-on resistance due to the short channel length:
    owing to the same conductivity type of the upper source region, upper channel region and upper drain region the short channel LMOS exhibits a threshold voltage whose value, depending upon the channel depth, spans from that of an enhancement mode to a depletion mode MOS device; and owing to the presence of the ICBP structure causing a correspondingly reduced surface electric field along the channel length the short channel LMOS exhibits a higher drain-source punch-through voltage than an otherwise short channel LMOS without the ICBP.

2. The short channel LMOS with ICBP of claim 1 wherein said upper drain region further comprises a plurality of serially connected drain sub-regions all of a first conductivity type and arranged predominantly along the horizontal direction with:
    a first drain sub-region in contact with the upper channel region and shaped, in conjunction with said upper body region, to form part of the ICBP; and
    a last drain sub-region, most distant to the upper channel region, shaped to reveal a sufficient top surface area for making electrical contact with an external drain contact electrode.

3. The short channel LMOS with ICBP of claim 2 wherein said first drain sub-region is a portion of said lower device bulk layer that gets separated there from by the presence of the buried body protrusion.

4. The short channel LMOS with ICBP of claim 1 further comprises an upper body-contact region of a second conductivity type in body contact with said upper body region and shaped to reveal a sufficient top surface area for making electrical contact with an external body contact electrode.

5. The short channel LMOS with ICBP of claim 4 wherein the portion of said upper body region between the upper source region and the upper drain region extends downwardly deeper than the upper source region and the upper drain region whereby forms the body contact between the upper body region and the upper body-contact region.

* * * * *